United States Patent [19]
Congdon et al.

[11] Patent Number: 4,700,100
[45] Date of Patent: Oct. 13, 1987

[54] FLEXURAL DISK RESONANT CAVITY TRANSDUCER

[75] Inventors: John C. Congdon; Thomas A. Whitmore, both of Fort Wayne, Ind.

[73] Assignee: Magnavox Government and Industrial Electronics Company, Fort Wayne, Ind.

[21] Appl. No.: 903,018

[22] Filed: Sep. 2, 1986

[51] Int. Cl.[4] .............................................. H01L 41/08
[52] U.S. Cl. .................................... 310/332; 310/326; 310/337; 310/324; 367/155
[58] Field of Search ............... 310/321, 322, 324, 326, 310/330-332, 334, 337; 367/155, 160-162

[56] References Cited

U.S. PATENT DOCUMENTS

| | | | |
|---|---|---|---|
| 3,255,431 | 6/1966 | Howatt | 310/337 X |
| 3,660,809 | 5/1972 | Pearson | 367/155 |
| 3,832,762 | 9/1974 | Johnston et al. | 310/337 X |
| 4,413,198 | 11/1983 | Bost | 310/322 X |
| 4,546,459 | 10/1985 | Congdon | 367/155 |
| 4,604,542 | 8/1986 | Thompson | 310/334 |

OTHER PUBLICATIONS

Underwater Helmholtz-Resonator Transducers: General Design Principles, by A. S. Woollett, NUSC Technical Report 5633, 7-5-77.

Underwater Transducer Wetting Agents, by Ivey & Thompson, JASA vol. 78, No. 2, Aug. 1985, pp. 389-394.

*Acoustics*, by Beranek, McGraw-Hill Book Co., 1954, pp. 212-221.

*Primary Examiner*—Mark O. Budd
*Attorney, Agent, or Firm*—Roger M. Rickert; Richard T. Seeger; Thomas A. Briody

[57] ABSTRACT

Omnidirectional sonic transducers suitable for underwater operation as either hydrophones (listening devices) or projectors (sonic sources) are disclosed. The transducing device has a hollow resonant cavity with at least one flexural disk mounted therein in acoustic communication with both the interior and exterior of the cavity. The cavity also has at least one aperture providing acoustic coupling between the cavity interior and exterior, and a pliant lining covering substantially the entire cavity inner surface except for flexural disk surfaces and the aperture to detune the natural cavity resonance by reducing the rigidity of the cavity inner surface, thereby improving the overall frequency response characteristics of the transducing device.

30 Claims, 3 Drawing Figures

FLEXURAL DISK RESONANT CAVITY TRANSDUCER

SUMMARY OF THE INVENTION

The present invention relates generally to electroacoustical transducers and more particularly to such transducers for underwater projection or listening at wavelengths which are significantly greater than the dimensions of the transducer. More specifically, an illustrative transducer according to the present invention employs flexural piezoelectric disks in a detuned Helmholtz type resonant cavity.

Hydrophones or underwater sonic receivers as well as underwater projectors or sound transmitting devices find a wide range of applications in underwater exploration, depth finding and other navigational tasks, commercial as well as recreational fishing, and in both active and passive sonar and sonobuoy systems. Because of the comparatively longer wavelengths of sound transmitted in water, an underwater environment presents unique problems not encountered, for example, in conventional audio loud speaker design where the transducers are of a size comparable to or greater than the wave lengths encountered. The transducers employed in such systems may have a selective directional radiation or response pattern, or may be directionally insensitive or omnidirectional depending on the system design and requirements. Such transducers are typically reciprocal in the sense that if electrically energized, they emit a particular sonic response while if subjected to a particular sonic vibration, they emit a corresponding electrical response. The transducer of the present invention exhibits such reciprocity. The transducer elements, where the actual electrical-mechanical conversion takes place, can take numerous forms as can the transducer (transducer elements along the related structure).

One known type of transducer element suitable for use in the present invention is the flexural disk. Flexural disk transducers have been used in the past for low frequency acoustical sources for underwater sound. The disks are fabricated with piezoelectric ceramic and a metal lamination bonded together in a bilaminar or trilaminar configuration. The composite disk is supported at its edges so that the disk will vibrate in a flexural mode similar to the motion of the bottom of an old-fashion oil can bottom when depressed to dispense oil.

Such a disk, if simply supported at its edges and energized, will radiate sound from both sides giving rise to a directional radiation pattern which is proportional to the cosine of the angle measured from the normal to the face of the disk, i.e., a dipole-type or figure-eight pattern. The efficiency of such an arrangement is quite low for wavelengths which are long as compared to the diameter of the disk.

When an omnidirectional directivity pattern is required, one side of the disk is made ineffective by enclosing one side of the disk in a closed cavity filled with air or other gas, and frequently two such disks sharing a common air filled cavity are used in a back-to-back configuration. At depths beyond very modest ones, the hydrostatic pressure on the disk surface exposed to the water becomes so great that pressure compensation in the form of additional air being introduced into the cavity is required. A pneumatic pressure compensation system is, of course, expensive, bulky, and generally detracts from the versatility of the transducer. While sound is radiated from one side only of each of the disks, the efficiency of this type system is better than where a single disk radiates from both sides.

Air pressure within such air backed disk arrangements must compensate for the hydrostatic pressure on the exposed disk surface to keep the transducer operating properly and, thus, must vary for varying depth of the transducer. Temperature variations introduce additional problems. Such air backed transducers can operate over a range of depths until the stiffness of the gas increases substantially and increases the resonant frequency of the transducer (or disk). In addition to the problems and expense of providing pneumatic compensation, such air backed transducers have a relatively narrow pass band or limited frequency range. Electrical tuning techniques have been employed to extend the bandwidth, but generally require correlative equalization or compensation further increasing the cost and complexity and reducing overall efficiency.

The air backed disk, despite its disadvantages, is, for a given transducer size, operable at lower frequencies than most other types of transducer configurations.

The need for air pressure compensation may be eliminated by flooding the air cavity with the surrounding liquid medium, thereby equalizing pressure on opposite disk faces. The liquid medium in the cavity may also be an oil such as castor oil or various silicone oils. If oil is used, the transducer is sealed with O-rings, encapsulants, or a rubber or plastic boot. The cavity apertures can have an elastomeric membrane or very resilient boot to provide a means to separate the oil in the cavity from the external water medium. Such attempts typically employ a resonant cavity of the Helmholtz variety with one or more tubes or necks at the cavity openings. A 1977 report summarizing Helmholtz resonator transducers is available from the Naval Underwater Systems Center entitled "Underwater Helmholtz Resonator Transducers: General Design Principles" by Ralph S. Woollett. The primary concern of this article is in the frequency range below 100 Hz. Attempts to achieve a relatively broad band flat frequency response from the transducers discussed therein were not altogether satisfactory, requiring drive level to be rolled off at higher frequencies and requiring acoustoelectrical feedback from a probe hydrophone in the cvity to flatten the response.

Among the several objects of the present invention may be noted the provision of an omnidirectional sonic transducer of enhanced temperature and pressure stability; the provision of a sonic transducer for operation in a liquid medium over a range of wavelengths, the shortest of which exceeds the size of the transducer; the provision of a uniquely detuned Helmholtz resonator; the provision of a small, light weight and relatively efficient sonic transducer; the overall increase in efficiency of a small (as compared to wavelength) acoustical source; and the provision of a technique for designing a sonic transducer using its several natural resonances to shape the passband. These as well as other objects and advantageous features of the present invention will be in part apparent and in part pointed out hereinafter.

In general, an underwater electroacoustical transducing device of the Helmholtz type has a hollow resonant cavity, a transducing flexural disk in acoustic communication with both the interior and exterior of the cavity, a cavity aperture acoustically coupling the interior and exterior of the cavity, and a pliant surface extending over a substantial portion of the cavity inner surface.

Also in general and in one form of the invention, an omnidirectional transducer for immersion and operation in a liquid medium has a hollow rigid cavity defining enclosure with an electromechanical transducer element acoustically coupled to both the exterior and the interior cavity of the enclosure. There is an orifice in the enclosure for admitting liquid thereto and for providing acoustic coupling between the admitted liquid in the cavity and liquid surrounding the enclosure, and a pliant lining within the enclosure for reducing the natural resonant frequency of the enclosure.

Still further in general and in one form of the invention, an omnidirectional sonic transducer of enhanced temperature and pressure stability is made by selecting a desired frequency range over which the transducer is to operate, providing a trilaminar piezoelectric flexural disk having a natural resonant frequency within the desired frequency range, providing a Helmholtz resonator having a natural resonant frequency within the desired frequency range, mounting the disk to the resonator to be acoustically coupled to both the interior and the exterior of the resonator, and detuning the resonator by reducing the rigidity of the inner surface thereof. Typically, the greatest dimension of the resonator provided is less than the shortest wavelength in the selected frequency range when the transducer is operated in an aqueous medium.

BRIEF DESCRIPTION OF THE DRAWING

Corresponding reference characters indicate corresponding parts throughout the several views of the drawing.

The exemplifications set out herein illustrate a preferred embodiment of the invention in one form thereof and such exemplifications are not to be construed as limiting the scope of the disclosure or the scope of the invention in any manner.

DESCRIPTION OF THE PREFERRED EMBODIMENT

Figure 1:
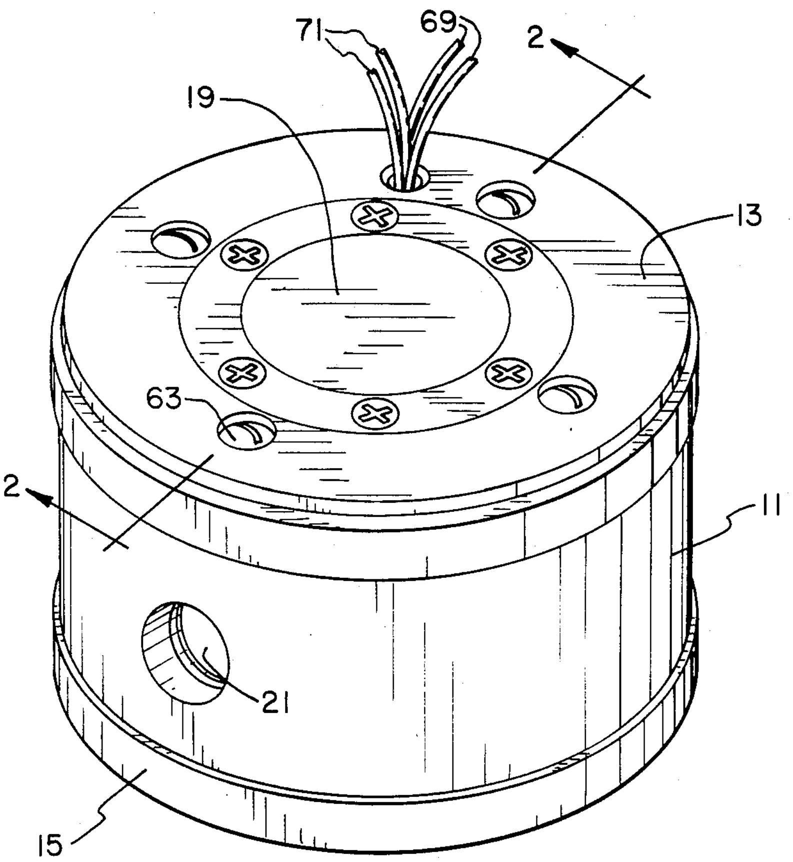
FIG. 1 is a perspective view of a sonic transducer incorporating one form of the invention.
Figure 2:
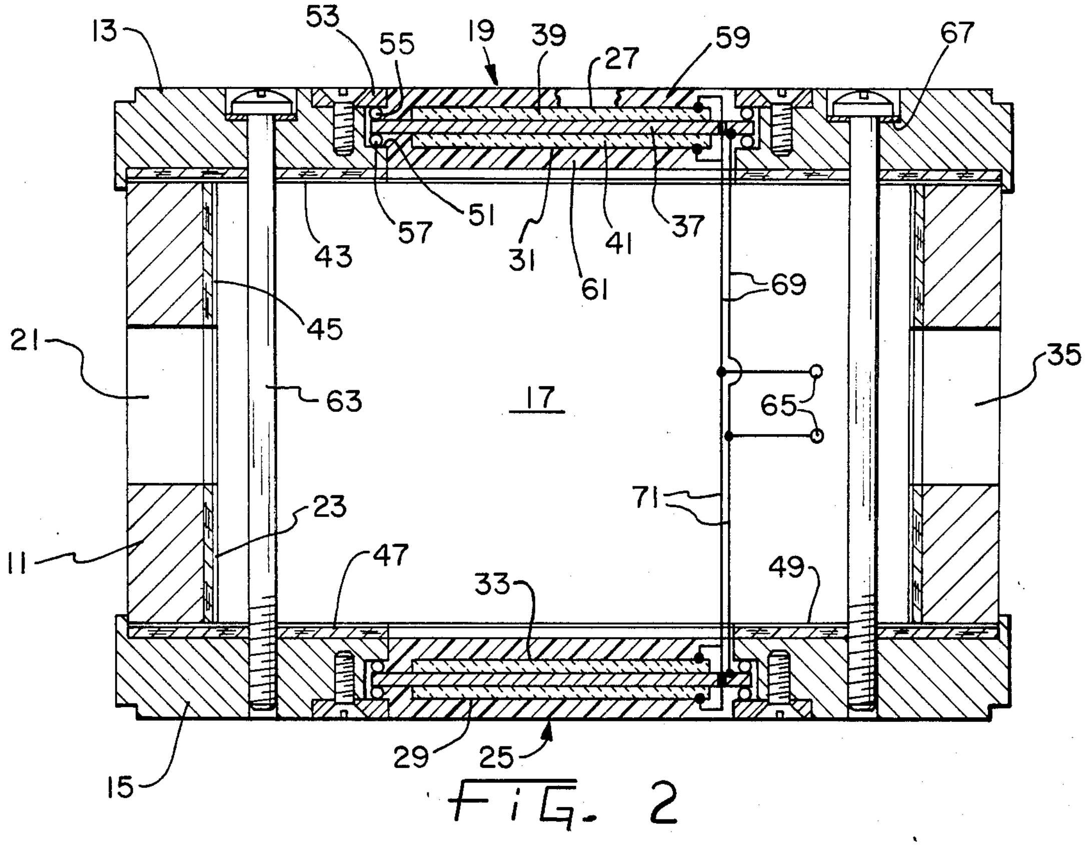
FIG. 2 is a view in cross-section along lines 2—2 of FIG. 1.

Referring to FIGS. 1 and 2, the sonic transducer is seen to include a hollow generally cylindrical cavity defining sidewall 11 with a pair of generally circular end walls 13 and 15 disposed at opposite extremities of the sidewall 11 to form in conjunction therwith a generally cylindrical cavity 17. An electromechanical transducer element 19 is centrally located in the end wall 13 and a sidewall aperture 21 is provided for admitting liquid to the cavity 17 as well as for providing sonic communication between liquid within the cavity and the surrounding liquid medium. A pliant interface 23 lies between the liquid medium within the cavity and at least a portion of the sidewall and end walls defining the cavity 17. Typically this layer 23 lines the entire cavity except for transducer element 19 and a second electromechanical transducer element 25 centrally located in the other end wall 15. Transducer element 25 is similar to transducer element 19 and electrically interconnected with that electromechanical transducer to move in opposition thereto when electrically energized.

The respective outer surfaces 27 and 29 of the transducer elements are directly acoustically coupled through encapsulation layers such as 59 with the external liquid medium and the inner surfaces 31 and 33 are similarly coupled (through layers such as 61) with the liquid medium within cavity 17. Surfaces 31 and 33 face those portions of the cavity inner surface not covered by lining 23. Aperture 21 and a like diametrically opposed sidewall aperture 35 provide sonic communication between the liquid within cavity 17 and the surrounding or external liquid medium. The transducer is typically deployed with apertures 21 and 35 vertically aligned, thus allowing the cavity 17 to rapidly fill with water as the transducer is submersed.

Each of the electromechanical transducer elements 19 and 25 may advantageously be a ceramic piezoelectric electroacoustic transducer element operable in a flexural mode and formed as a trilaminate structure with a metallic plate 37 sandwiched between a pair of ceramic piezoelectric slabs 39 and 41. The piezoelectric slabs are poled to respond to applied voltage in a flexural mode and in opposition to one another. With the illustrated electrical interconnections, upper slab 39 could have its upper face poled positive and the face against brass plate 37 poled negative while lower slab 41 would have its positively poled face against the plate 37. The outer or bottom face 29 of the outer slab of transducer 25 would be positive while the two slab faces against the bottom brass plate would be oppositely poled. With the interconnection schematically shown in FIG. 2, the two transducer elements, when energized by a signal applied across terminals 65, are either both flexing inwardly toward one another or outwardly away from one another. The pairs of leads 69 and 71 from the respective transducing elements may extend separately from the transducer as illustrated in FIG. 1 or may be connected in parallel for simultaneous energization as shown schematically in FIG. 2.

As noted earlier, the flooded cavity 17 with one or more apertures such as 21 behaves like a Helmholtz resonator except that the effect of the lining 23 is to detune the cavity somewhat by reducing the rigidity of the inner cavity surface. This lining 23 behaves as a pressure release material and comprises sheets 43, 45 and 47 of compressible material adhered to the inner surfaces of the sidewall and end walls. The layer of compressible material has a low surface tension surface such as surface 49 exposed to the liquid within the cavity to reduce air bubble retention and ensure good surface contact between the pliant interface and the liquid.

Surface tension is actually a property of the liquid medium. The goal in providing surface 49 is to completely wet the cavity interior when the transducer is immersed in water. In more technical terms, this goal is approached by reducing the contact angle between the liquid and the transducer surface. In general, this is in turn achieved by keeping the surface energy of the transducer as high as possible while the surface energy of the water is maintained as low as possible. For a more complete discussion of the problem of air bubble formation and retention, reference may be had to the article Underwater Transducer Wetting Agents by Ivey and Thompson appearing in the August 1985 Journal of the Acoustical Society of American wherien it is suggested that the active face of a transducer should be as clean and free of oils as possible (high surface energy) and a wetting agent applied (lowering the surfce energy of the surrounding water). The concept of keeping the contact angle low and therefore adequately wetting the surface is a function of both the particular liquid medium and the material. This concept relative to the exemplary water medium is referred to herein as "a low surface tension surface" or "a small contact angle surface."

The low surface tension surface may comprise a metallic foil coating one side of the layer of compressible material and the layer of compressible material may be a composition of cork and a rubber-like material. An Armstrong floor covering material known as "corprene" or "chloroprene" about one-sixteenth inch thick with a 0.002 inch thick foil adhered thereto forming the low surface tension surface has been found suitable. Other possible pliant lining materials include polyurethanes or silicones. The lining may be formed from a metal or plastic having a honeycomb or apertured surfce to achieve the detuning effect.

In early experimental transducer prototypes, the cylindrical sidewall 11 as well as the end plates 13 and 15 are made of aluminum, however, it has been discoverred that an overall weight reduction without operational degradation can be achieved by forming the cylindrical sidewall of a lightweight rigid graphite composite. Such a graphite composite is hard with a large elastic modulus and a density only about one-half that of the aluminum it replaced. The hollow cylindrical configuration is achieved by laying graphite fibres on a mandrel or cylindrical form and coating the fibres with an expoxy resin. Typically, several layers of fibres, sometimes precoated with resin, are applied to the mandrel with the technique resembling that currently employed in the manufacture of fibreglass flagpoles and similar fibreglass tubes. When the resin has cured, the hollow cylinder is removed from the mandrel, surface and end finished and the holes 21 and 35 bored to complete the sidewall 11.

Figure 3:
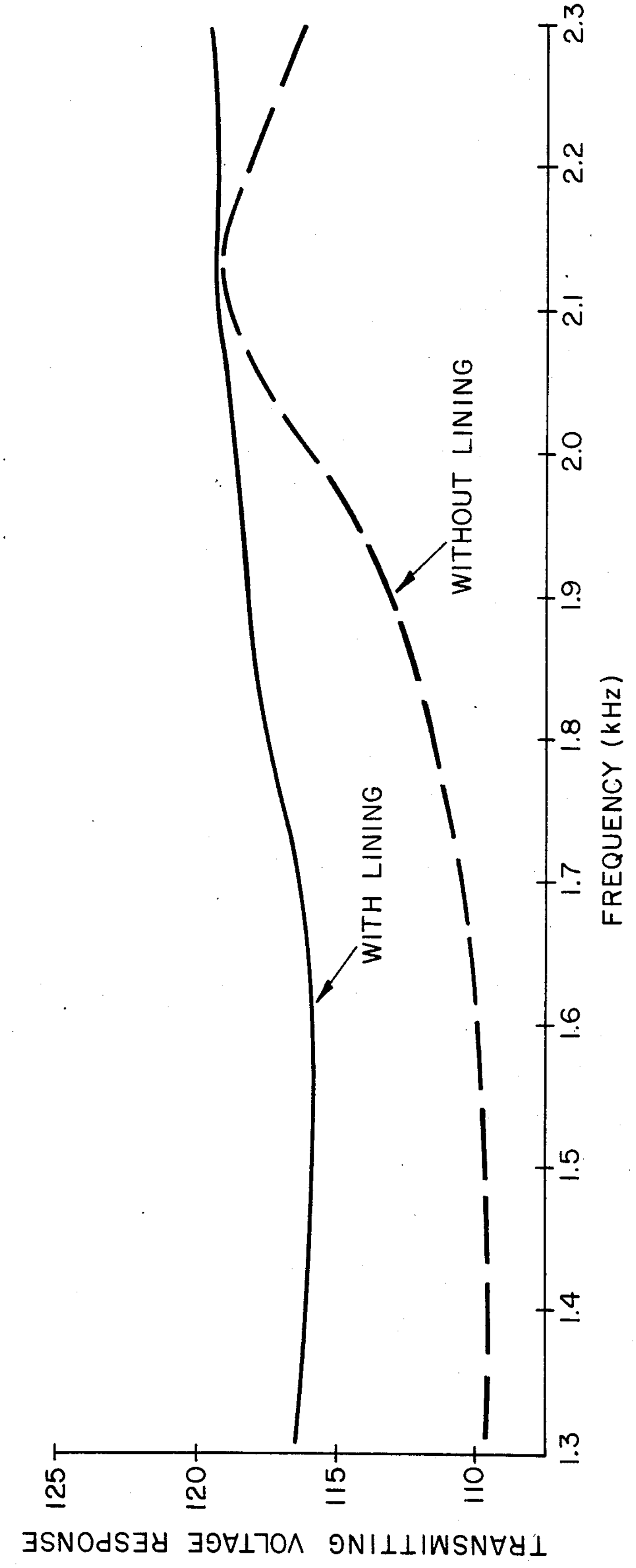
FIG. 3 is a frequency response curve for the transducer of FIGS. 1 and 2.

The process of making an omnidirectional sonic transducer of enhanced temperature and pressure stability includes the selection of a desired frequency range over which the transducer is to operate such as the illustrative range spanned by the abscissa in FIG. 3. A trilaminar piezoelectric flexural disk such as 19 is provided having a natural resonant frequency within the desired frequency range as is a Helmholtz resonator such as the cavity defined by sidewall 11 and end plates 13 and 15 which also has a natural resonant frequency within the desired frequency range. Mounting of the disk to the resonator is accomplished by capturing the metal plate 37 between a pair of wire "o" rings 55 and 57 which provide a knife edge mounting in which the disk may flex and which in turn are captive between an annular shoulder 51 in the end plate 13 and a mounting annulus 53. For best results, the plate 37 should not contact the end ring 13, but rather, should be slightly annularly spaced inwardly therefrom as illustrated in FIG. 2. The pockets 59 and 61 to either side of the disk may be filled with a low durometer polyurethane potting material having acoustical properties similar to water to protect the disk yet allow the disk to be acoustically coupled to both the interior and the exterior of the resonator.

Detuning of the resonator by reducing the rigidity of the inner surface thereof is accomplished by lining the end plates and sidewall with the sheets of lining material 43, 45 and 47.

In assembling the transducer, the foil surfaced linings 43 and 47 are adhered to the respective end plates 13 and 15, the foild surfaced lining 45 adhered to the inner annular surface of sidewall 11, and thereafter, the end plates assembled to the sidewall by screws such as 63 recessed in end plate 13 and threadedly engaging end plate 15. As illustrated, these screws 63 pass through the cavity 17, however if it is desired, each end plate may be screw fastened to the cylindrical sidewall. Compression washers such as 67 as well as the presence of lining material between the end plates and the sidewall may aid in eliminating undesired mechanical resonances.

The transducer of the present invention was earlier described as "small" in comparison to the wavelengths involved. Taking the passband of FIG. 3 as illustrative and recalling that sound propagates in water approximately five times as fast as in air, the range of wavelengths for the passband of about 1300 to 2300 kilohertz is between about 45 and 25 inches. The transducer from which the illustrated frequency data was derived had a diameter of slightly under four and one-half inches, a height of about two and one-half inches, and a pair of three-quarter inch sidewall holes while the transducing elements such as 19 were each formed on a brass plate about two and one-half inches in diameter with ceramic slabs of around one and one-half inch diameter. Thus, over the range of wavelengths of interest, the greatest dimension of the resonator is about five inches which is less than the shortest wavelength in the selected frequency range when the transducer is operated in an aqueous medium while the largest dimension of the transducing element per se is about one-tenth the shortest wavelength.

FIG. 3 shows two frequency response curves for the just described illustrative configuration. Note that without the lining 43, 45 and 47, the frequency response shown as a dashed line is far less uniform with a peak at about 2.13 kHz. This peak is due in part to the resonant frequency of the transducing elements and in part to the resonant frequency of the cavity, however, if those two resonant frequencies are separated further or the coupling reduced, two peaks may occur. The addition of the detuning lining smoothes the curve considerably making a relative flat response curve as illustrated by the solid line. The output or ordinate values shown are micropascal units of sound pressure on a decibel scale. This is a calibrated number for one meter spacing from the source and one volt energization from which actual sound pressure for any spacing and any drive voltage may be readily calculated. The relative improvement in response characteristics due to the addition of the lining is readily apparent.

Further passband shaping is possible by electrically tuning the transducer, for example, by placing an inductance in series with the transducer. Such tuning may also lower the power factor making the match to a power amplifier better for greater power transfer.

As noted earlier, temperature stability is enhanced with the use of a liner in the cavity. Hydrostatic pressure stability is obtained by free-flooding the cavity. Stability of the Transmitting Voltage Response (TVR) or sonic output with frequency is facilitated by using liners which function as pressure release materials to maintain the same acoustic impedance over the desired pressure range.

In summary then, and acoustical source or listening device for underwater omnidirectional sound applications which is small, lightweight and yet efficient and of an appreciable bandwidth has been disclosed. The device has inherent hydrostatic pressure (depth) compensation and its response characteristics are substantially temperature independent.

From the foregoing, it is now apparent that a novel arrangement has been disclosed meeting the objects and advantageous features set out hereinbefore as well as others, and that numerous modifications as to the precise shapes, configurations and details may be made by those having ordinary skill in the art without departing from the spirit of the invention or the scope thereof as set out by the claims which follow.

What is claimed is:

1. A sonic transducer for immersion and operation in a liquid medium over a range of sonic wavelengths the shortest of which exceeds the greatest dimension of the transducer comprising:

- a hollow generally cylindrical cavity defining sidewall;
- a pair of generally circular end walls disposed at opposite extremities of the sidewall to form in conjunction therewith a generally cylindrical cavity;
- an electromechanical transducer element centrally located in one of the end walls;
- a sidewall aperture for admitting liquid to the cavity and for providing sonic communication between liquid within the cavity and the surrounding liquid medium; and
- a pliant interface between the liquid medium within the cavity and at least a portion of the sidewall and end walls defining the cavity.

2. The transducer of claim 1 further comprising a second electromechanical transducer element centrally located in the other of the end walls and electrically interconnected with said electromechanical transducer to move in opposition thereto when electrically energized.

3. The transducer of claim 2 wherein both electromechanical transducer elements are acoustically coupled to both the liquid medium within the cavity and the surrounding liquid medium.

4. The transducer of claim 3 wherein the pliant interface lines substantially the entire cavity with the exception of the electromechanical transducer elements and sidewall aperture.

5. The transducer of claim 4 wherein the pliant interface comprises a layer of compressible material adhered to the inner surfaces of the sidewall and end walls.

6. The transducer of claim 5 wherein the layer of compression material has a low surface tension surface exposed to the liquid within the cavity to ensure good surface contact between the pliant interface and the liquid.

7. The transducer of claim 6 wherein the low surface tension surface comprises a metallic foil coating one side of the layer of compressible material.

8. The transducer of claim 5 wherein the layer of compressible material is a composition of cork and a rubber-like material.

9. The transducer of claim 1 further comprising a second sidewall aperture diametrically opposite said sidewall aperture.

10. The transducer of claim 1 wherein said electromechanical transducer element is a ceramic piezoelectric eletroacoustic transducer element.

11. The transducer of claim 10 wherein said electromechanical transducer element is a trilaminate structure with a metallic plate sandwiched between a pair of ceramic piezoelectric slabs.

12. The transducer of claim 11 wherein the piezoelectric slabs are poled to respond to applied voltage in a flexural mode.

13. The transducer of claim 1 wherein the cavity defining sidewall is formed of a lightweight rigid graphite composite material.

14. An omnidirectional transducer for immersion and operation in a liquid medium comprising:

- a hollow rigid cavity defining enclosure;
- an electromechanical transducer element acoustically coupled to both the exterior and the interior cavity of the enclosure;
- an orifice in the enclosure for admitting liquid thereto and for providing acoustic coupling between the admitted liquid in the cavity and liquid surrounding the enclosure; and
- a pliant lining within the enclosure for reducing the natural resonant frequency of the enclosure.

15. The transducer of claim 14 further comprising a second electromechanical transducer element acoustically coupled to both the exterior and the interior cavity of the enclosure, and electrically interconnected with said electromechanical transducer to move in opposition thereto when electrically energized.

16. The transducer of claim 15 wherein the pliant lining lines substantially the entire cavity with the exception of the electromechanical transducer elements and orifice.

17. The transducer of claim 16 wherein the pliant lining comprises a layer of compressible material adhered to the inner surfaces of the enclosure.

18. The transducer of claim 17 wherein the layer of compressible material has a low surface tension surface exposed to the liquid within the cavity to reduce the retention of air bubbles and consequent erratic transducer operation.

19. The transducer of claim 18 wherein the low surface tension surface comprises a metallic foil coating one side of the layer of compressible material.

20. The transducer of claim 17 wherein the layer of compressible material is a composition of cork and a rubber-like material.

21. The transducer of claim 14 wherein said electromechanical transducer element is a ceramic piezoelectric electroacoustic transducer element.

22. The transducer of claim 21 wherein said electromechanical transducer element is a tilaminate structure with a metallic plate sandwiched between a pair of ceramic piezoelectric slabs.

23. The transducer of claim 22 wherein the piezoelectric slabs are poled to respond to applied voltage in a flexural mode.

24. The transducer of claim 14 operable over a range of sonic wavelengths the shortest of which exceeds the greatest dimension of the transducer and is on the order of one-tenth the greatest dimension of the electromechanical transducer element.

25. An underwater electroacoustical transducing device of the Helmholtz type having a hollow resonant cavity, a transducing flexural disk in acoustic communication with both the interior and exterior of the cavity, a cavity aperture acoustically coupling the interior and exterior of the cavity, and a pliant surface extending over a substantial portion of the cavity inner surface.

26. The transducing device of claim 25 wherein the pliant surface lines substantially the entire inner surface of cavity with the exception of the electromechanical transducer elements and aperture.

27. The transducing device of claim 26 wherein the pliant surface comprises a layer of compressible material adhered to the inner surface of the cavity.

28. The transducing device of claim 27 wherein the layer of compressible material has a low surface tension surface exposed to the liquid within the cavity to reduce the retention of air bubbles and consequent erratic transducer operation.

29. The transducing device of claim 28 wherein the low surface tension surface comprises a metallic foil coating one side of the layer of compressible material.

30. The transducing device of claim 27 wherein the layer of compressible material is a composition of cork and a rubber-like material.

* * * * *